United States Patent [19]

Brenardi et al.

[11] Patent Number: 4,829,236
[45] Date of Patent: May 9, 1989

[54] DIGITAL-TO-ANALOG CALIBRATION SYSTEM

[75] Inventors: Ara Brenardi, Woodland Hills; Frank B. Parrish, Westlake Village, both of Calif.

[73] Assignee: Teradyne, Inc., Boston, Mass.

[21] Appl. No.: 115,151

[22] Filed: Oct. 30, 1987

[51] Int. Cl.⁴ .................. G01R 31/28; H03K 13/02
[52] U.S. Cl. ............................. 324/73 R; 324/130; 341/118
[58] Field of Search .............. 324/73 R, 130, 74; 340/347 CC; 341/118, 120

[56] References Cited

U.S. PATENT DOCUMENTS

| | | | |
|---|---|---|---|
| 4,340,882 | 7/1982 | Maio et al. | 340/347 CC |
| 4,381,495 | 4/1983 | Hotta et al. | 340/347 CC |
| 4,427,971 | 1/1984 | Whiteside et al. | 340/347 CC |
| 4,490,714 | 12/1984 | van de Plassche et al. | 340/347 CC |
| 4,733,167 | 3/1988 | Tamamura | 324/73 R |

Primary Examiner—Ernest F. Karlsen

[57] ABSTRACT

Calibrating a plurality of digital-to-analog converters using a calibration memory for storing calibration characteristics for respective digital-to-analog converters so as to provide uniform analog responses to digital data, and a calibrator to receive original digital data and to adjust it utilizing the stored calibration characteristics to produce adjusted digital data that, when inputted into a digital-to-analog converter, produce an analog signal that corresponds to the original digital data.

20 Claims, 3 Drawing Sheets

DIGITAL-TO-ANALOG CALIBRATION SYSTEM

FIELD OF THE INVENTION

The present invention relates to systems employing a plurality of digital-to-analog converters, e.g., automatic circuit test equipment.

BACKGROUND OF THE INVENTION

Digital-to-analog converters have offset and gain errors, resulting in different analog outputs in response to the same digital input.

In some automatic circuit testers, a plurality of digital-to-analog converters are calibrated when they are first installed.

SUMMARY OF THE INVENTION

In one aspect the invention features calibrating a plurality of digital-to-analog converters (DACs) by storing calibration characteristics for respective DACs in a calibration memory, and using the calibration characteristics stored for a DAC to adjust digital data as the data is sent to that DAC.

In preferred embodiments the DACs are part of an automatic circuit test system; there are both offset and gain correction characteristics stored in respective offset and gain memories; the digital data is adjusted by a multiplier/accumulator circuit according to the equation $y = mx + b$, where y is the adjusted digital data, m is a gain correction characteristic, x is the original digital data, and b is the offset correction characteristic; the multiplier/accumulator circuit is controlled by control signals from the control memory addressed by the same addresses used for the offset and gain memories and control signals from the state machine; an output multiplexer is used to selectively output to the DACs either the adjusted digital data or the original digital data; and an echo memory storing original digital data is used in conjunction with a last value register storing the last adjusted digital data and a read back multiplexer to provide selective read back of the original data, the last set of adjusted data, or data on the bus communicating with the DACs.

In another aspect the invention features a method of determining offset and gain correction characteristics for use in calibrating a plurality of DACs by measuring, for each DAC, the analog outputs resulting from inputting minimum and maximum values relating to a range of digital values expected to be used by the DAC. The offset and gain correction characteristics are determined in turn for each DAC and are stored at the same addresses in the offset and gain memories.

Such a system and calibration method permit very accurate calibration of precision 16-bit DACs (accurate to 100 $\mu$ volts) as digital data is provided to them at data bus speed. Because the DACs can be calibrated on each power-up, long-term changes in DAC characteristics are unimportant. In addition, accuracy is further promoted by determining the calibration characteristics for the range of digital values expected to be provided to a given DAC during a given test procedure.

Other advantages and features of the invention will be apparent from the following description of a preferred embodiment thereof.

DESCRIPTION OF THE PREFERRED EMBODIMENT

The preferred embodiment will no be described.

DRAWINGS

Figure 2:
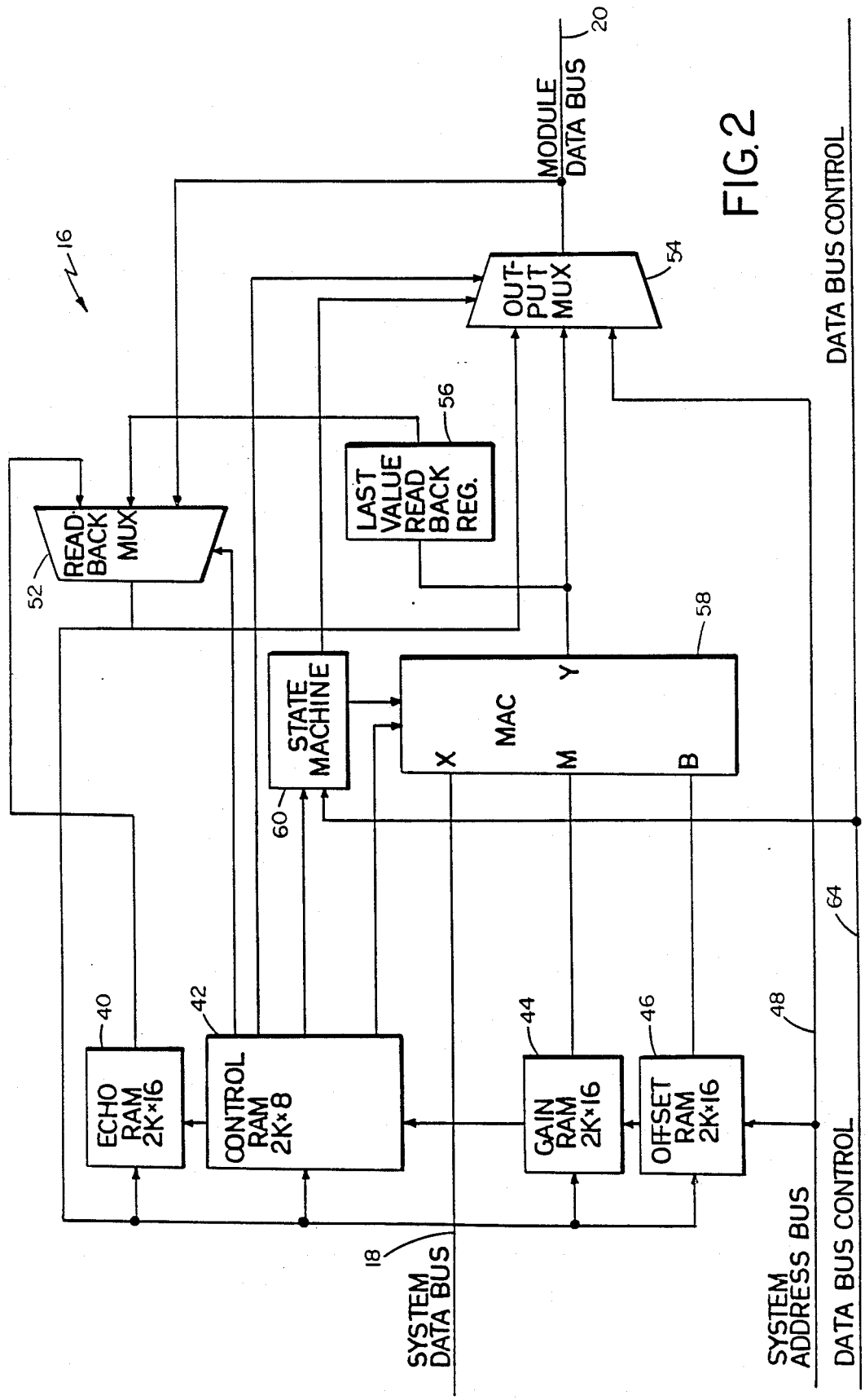
FIG. 2 is a block diagram of the digital-to-analog calibration circuit of the FIG. 1 system.
Figure 3A:
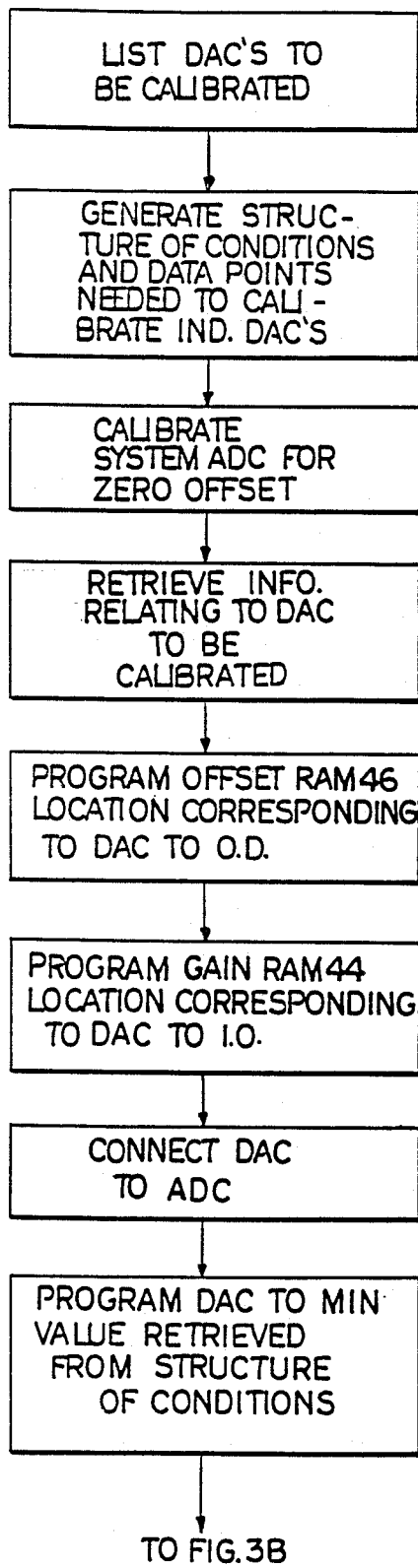
Figure 3B:
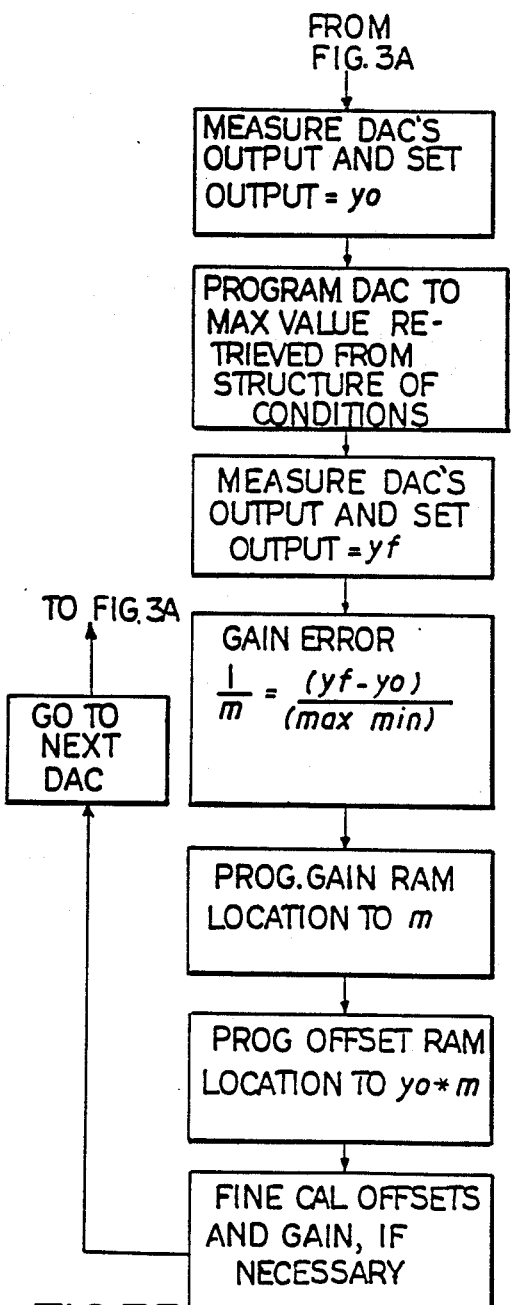

FIGS. 3A, and 3B are a flow chart of the calibration procedure employed by the FIG. 2 circuit.

STRUCTURE

Figure 1:
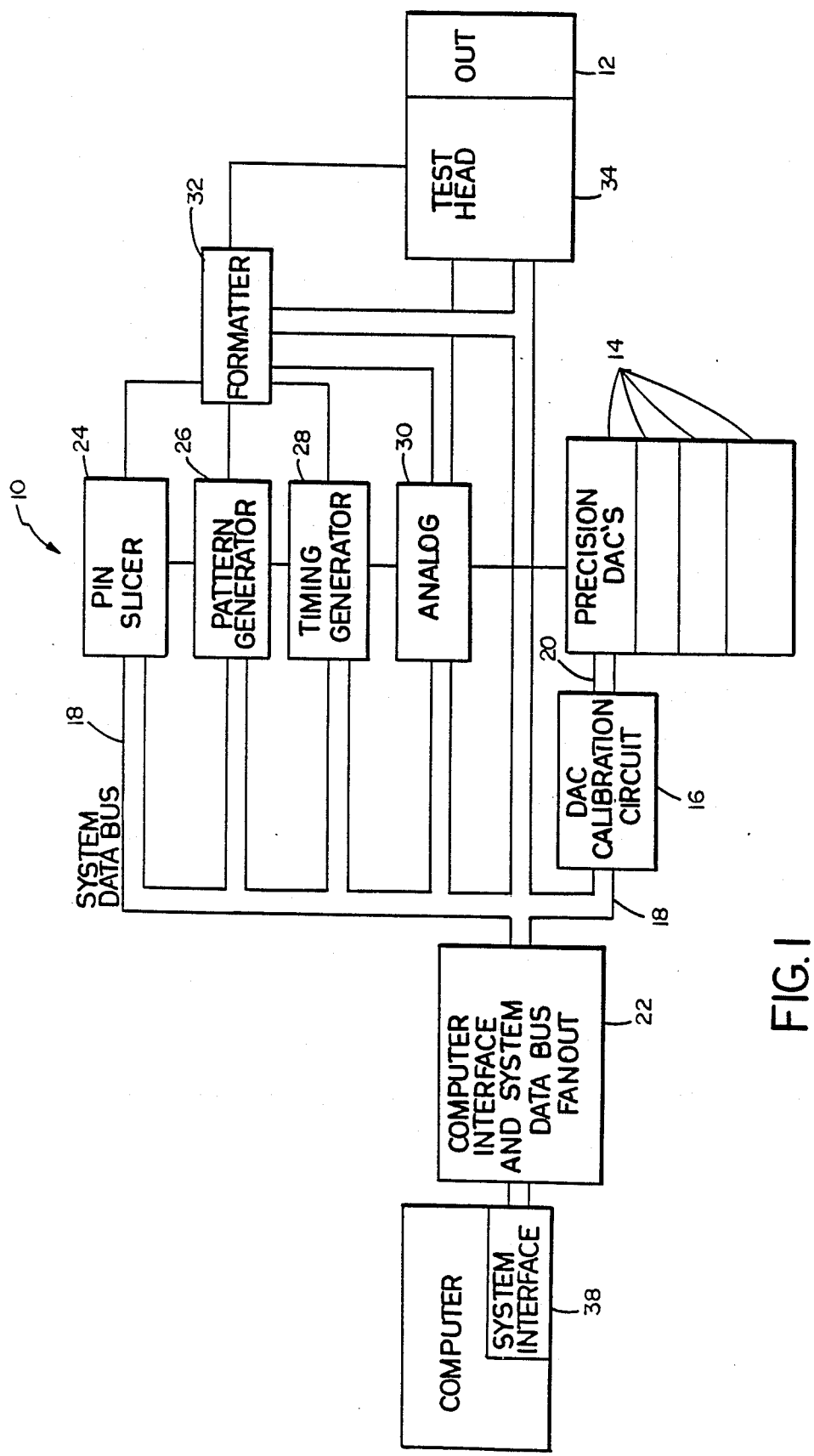
FIG. 1 is a block diagram of an automatic circuit test system having a digital-to analog calibration circuit according to the invention.

Referring to FIG. 1, automatic test system 10 for testing an electronic device under test (DUT) 12 employs a plurality of precise, 16-bit digital-to analog converters (DACs) 14. The single DAC calibration circuit 16 (described in detail below and in FIG. 2) is connected to receive original digital data from computer interface and data bus fanout 22 over system data bus 18 and to provide adjusted digital data to DACs 14 via module data bus 20 (also referred to as a D/A data bus).

Overall control of test system 10 is provided by computer 36, which is connected to computer interface and fanout 22 via system interface circuit 38. System data bus 18 is also connected to provide digital data to pin slice circuit 24, pattern generator 26, timing generator 28, analog circuits 30, formatter 32, and test head 34. Pin slice circuit 24, pattern generator 26, timing generator 28, and analog circuit 30 are all inputted into formatter 32 to provide inputs used in generation of test signals provided to DUT 12 via test head 34. Analog circuits 30 are also directly inputted to test head 34 to provide analog inputs to DUT 12.

Referring now to FIG. 2, DAC calibration circuit 16 includes echo RAM 40 (for storing unmodified digital data, control RAM 42 (for storing calibration and circuit operating control signals), gain RAM 44 (for storing gain correction characteristics), and offset RAM 46 (for storing offset correction characteristics), which are all connected to system address bus 48 as well as to system data bus 18. Gain RAM 44 and offset RAM 46 are connected to provide gain and offset correction characteristics (16-bit words), respectively, to multiplier/accumulator circuit (MAC) 58 to modify respective digital data provided directly to MAC 58 over system data bus 18. State machine 60 is inputted with an output from control RAM 42 and with signals on data bus control lines 64 and provides control of MAC 58, which is also controlled by control signals provided directly from control RAM 42. The output of MAC 58 is one of the inputs to output multiplexer 54, the output of which is provided at module data base 20. Output multiplexer 54 is controlled by an output of state machine 60 and an output of control RAM 42. System data bus 18 is also connected to the input of output multiplexer 54 (to permit bypassing the MAC calibration procedure), as well as the address bus 48 to send address information to DACs 14.

Read back multiplexer 52 is connected to selectively connect the output of echo RAM 40, the output of last value read back register 56, or data on module data bus 20 to system data bus 18 under control of control signals from control RAM 42.

OPERATION

In operation automatic test system 10 provides digital test patterns generated by pattern generator 26 to DUT 12 and compares outputs with expected outputs. Sixteen-bit DACs 14 are used to provide precise outputs (accurate to 100 μ volts to analog circuit 30, which in turn provides analog outputs used by timing generator 28, formatter 32, and test head 34.

Depending on the control data stored at the addresses in control RAM 42 after power up initialization sequence, DAC calibration circuit 16 is used in two modes: as a normal data bus or as a data modification system. When DAC calibration circuit 16 is operating as a normal data bus, the data, address, and control signals are simply buffered and then sent to DACs 14. When DAC calibration circuit 16 is operating as a data modification system, data being input via system data bus 18 is manipulated by MAC 58 according to the function $y=mx+b$, where y is the value of manipulated data that is outputted to DACs 14, x is the value of the original data, m is the gain correction characteristic stored in gain RAM 44 for the DAC 14 being addressed, and b is the offset correction characteristic stored in offset RAM 46 for the DAC 14 being addressed. In either mode the digital data is sent to a respective DAC 14 after that DAC's address has been sent over the system address bus.

The gain and offset correction characteristics are determined and stored during system initialization, using a system analog-to-digital converter (ADC) and analog multiplexer switch matrix (both not shown) to measure responses of DACs 14 when providing voltages related to the range of voltages they are to provide during actual circuit testing. Referring to FIG. 3, when calibrating DACs 14, computer 36 generates a list of DACs 14 to be calibrated, generates structures that include specific conditions and data points used to calibrate individual DACs 14 (including maximum and minimum input values for calibration), and calibrates the system ADC for zero offset. Each DAC 14 to be calibrated is then calibrated in turn. The offset correction value in offset RAM 46 is set to 0.0 volt, and the gain correction value in gain RAM 44 is set to 1.0. DAC 14 is then provided over module data bus 20 with a minimum digital value relating to a range of values that DAC 14 is expected to receive during testing ("MIN"), and its resulting analog output is measured; this value is labeled "y0". DAC 14 is then set to a maximum expected value relating to the range of expected values ("MAX"), and its output is measured; this value is labeled "yf". The gain error is equal to $(yf-y0)/(MAX-MIN)$. The reciprocal of the gain error is the gain correction characteristic m, which is stored at the address in gain RAM 44 corresponding to this DAC 14. The offset correction characteristic is set equal to y0 * m and is stored in offset RAM 46 at the same address. The offset and gain values are verified by using them to modify digital data that are in the range of expected values and are inputted on system data bus 18. The resulting analog outputs are measured by the system ADC and compared with the unmodified digital data to see if the differences between the two are within acceptable limits. If the differences are within acceptable limits, the next DAC 14 is calibrated. If the differences are greater than acceptable limits, a fine calibration procedure is performed. Determinations are made as to whether y or m or both need fine calibration; if there are unacceptable differences in the lower part of the range, where m has little effect, then b should be finely calibrated; if there are unacceptable differences in the upper part of the range, where m has greater effect, then m should be finely calibrated; if there are differences in both parts of the range, both are finely calibrated, b first, then m. In doing each fine calibration, the b or m value is individually incremented or decremented, and each new m or b value is tested with a plurality of unmodified data within the range of expected values. The resulting outputs are compared with unmodified data to see if the new b or m value results in differences between input and output that are within acceptable limits. If the differences are still outside limits but are getting smaller, the b or m value is stepped again in the same direction as the last step. If the differences are larger than for the last b or m value, the new b or m value is stepped in the other direction. If the sign of the differences changes, then the direction is reversed, and the step size is decreased.

This calibration procedure is employed for each DAC 14 to be calibrated using MAX and MIN values relating to the range of expected digital values to be received by a particular DAC 14.

Appropriate control signals for causing state machine 60 and MAC 58 to perform the $y=mx+b$ function are loaded in control RAM 42 during power-up initialization sequence. Control signals to bypass the MAC calibration method are loaded into RAM 42 at addresses relating to DACs 14 that will receive unmodified digital data in the normal data bus mode.

During a circuit testing procedure, DACs 14 are set by computer 36 according to digital values provided on system data bus 18 to DAC calibration circuit 16. When calibration circuit 16 receives a digital signal for a DAC 14 having gain and offset correction values stored in the associated address in RAMs 44, 46, control signals at the same address in control RAM 42 cause the value of the original digital signal (x) to be multiplied by the gain correction characteristic (m) in gain RAM 44 and to be added to the offset correction characteristic (b) in offset RAM 46. The multiplication and addition are performed in MAC 58 under the control of control signals from control RAM 42 and state machine 60, which has 16 states. The output is provided through output multiplexer 54 to module data bus 20. As hardwired logic is employed to perform the simple multiplication and addition, the digital data is corrected and quickly provided to the respective DAC 14 at data bus speed. The analog signal provided by DAC 14 corresponds to the original data, as the data modification compensated for gain and offset errors of the DAC. When calibration circuit 16 receives a digital signal to be sent unmodified to its respective DAC, the control signals stored in RAM 42 cause the data to be sent unmodified through output multiplexer 54.

All original data provided on system data bus 18 is stored in echo RAM 40, whether it is to be modified or not by calibration circuit 16. If computer 36 needs to read back the digital data sent out by it, the data is read back from echo RAM 40 through read back multiplexer 52 as specified by control RAM 42. If computer 36 needs to read back the digital data actually sent to DACs 14, module data bus 20 is connected through read back multiplexer 52. To read a particular digital number that has just been modified, the number stored in register 56 is sent through read back multiplexer 52.

OTHER EMBODIMENTS

Other embodiments of the invention are within the scope of the following claims.

What is claimed is:

1. An automatic test system for testing an electronic device under test comprising
    a plurality of digital-to-analog converters,
    a calibration memory having a unique address corresponding to each of said plurality of digital-to-analog converters, said memory storing respective calibration characteristics for respective said digital-to-analog converters at respective said unique addresses so as to provide uniform analog responses to digital data from said plurality of digital-to-analog converters, and
    calibration means to receive original digital data for a particular digital-to-analog converter and respective calibration characteristics for said particular digital-to-analog converter and to adjust said original digital data utilizing said respective stored calibration characteristics to produce adjusted digital data that, when inputted into a said respective digital-to-analog converter, produce an analog signal that corresponds to said original digital data.

2. The system of claim 1 wherein said digital-to-analog converters have respective offset and gain errors, and said calibration memory comprises an offset memory for storing offset correction characteristics of said plurality of digital to-analog converters, and a gain memory for storing gain correction characteristics of said plurality of digital-to analog converters,
    said calibration characteristics comprising said offset correction characteristics and said gain correction characteristics.

3. The system of claim 2 wherein said calibration means comprises a multiplier/accumulator circuit which produces said adjusted digital data according to the equation $y = mx + b$ where,
    y is said adjusted digital data,
    m is a said gain correction characteristic,
    x is said original digital data, and
    b is a said offset correction characteristic.

4. The system of claim 3 further comprising
    a control memory for storing control signals to control said multiplier/accumulator circuit, said control memory being addressed by an address which corresponds to an address for said gain memory and said offset memory and a DAC address.

5. The system of claim 4 further comprising
    a state machine for controlling said multiplier/accumulator circuit in response to at least one said control signal from said control memory.

6. The system of 1 further comprising
    a system data bus connected to provide said original digital data to said calibration means,
    a D/A data bus connected to provide said adjusted digital data from said calibration means to said plurality of digital to analog converters,
    a system address bus to provide DAC addresses, and
    an output multiplexer which is connected to selectively output to said D/A data bus either said original digital data from said system data bus or said adjusted digital data from said calibration means after address information has been sent to the digital-to-analog converters.

7. The system claim 6 further comprising
    an echo memory connected to said system data bus to store said original digital data for respective said converters, and
    a read back multiplexer which is connected to selectively output either said original data stored in said echo memory or data provided over said module data bus.

8. The system of claim 7 further comprising
    means to store the last output of said calibration means, said means to store having an output that is provided as a further input to said read back multiplexer.

9. A method of calibrating a plurality of digital-to-analog converters in a system for automatically testing an electronic device under test comprising
    storing respective calibration characteristics for respective said digital-to-analog converters at unique memory addresses corresponding to each of said plurality of digital-to-analog converters so as to provide uniform analog responses to digital data,
    receiving original digital data for a particular digital-to-analog converter and respective calibration characteristics for said particular digital-to-analog converter, and
    adjusting said original digital data utilizing said respective stored calibration characteristics to produce adjusted digital data that, when said adjusted digital data are inputted into a said particular digital-to-analog converter, produce an analog signal that corresponds to said original digital data.

10. The method of claim 9 wherein said digital to-analog converters have respective offset and gain errors, and
    said calibration characteristics comprise offset correction characteristics and gain correction characteristics.

11. The method of claim 10 wherein said adjusting is performed according to the equation $y = mx + b$ where:
    y is said adjusted digital data,
    m is a said gain correction characteristic,
    x is said original data, and
    b is a said offset correction characteristic.

12. The method of claim 11 further comprising
    providing an offset memory for storing said offset correction characteristics of said plurality of digital-to analog converters at respective addresses, and providing a gain memory for storing said gain correction characteristics of said plurality of digital to-analog converters at corresponding addresses,
    determining said offset and gain correction characteristics, and
    storing said offset and gain correction characteristics at respective addresses.

13. The method of claim 12 wherein said determining comprises
    inputting a said digital-to-analog converter with a minimum value (MIN),
    measuring the digital-to-analog converter's minimum value output (y0),
    inputting the digital to analog converter with a maximum value (MAX),
    measuring the digital to analog converter's maximum value output (yf),
    determining m by calculating (MAX MIN)/(yf y0),
    determining b based upon MAX, MIN, yf and y0, and
    repeating said inputting MIN, measuring y0, inputting MAX, measuring yf, determining m, and determining b for all said digital-to-analog converters.

14. Circuitry having a plurality of digital inputs and a corresponding plurality of analog outputs comprising
- a plurality of digital-to-analog converters, said digital-to-analog converters having respective offset and gain characteristics,
- an offset memory having a unique address corresponding to each of said plurality of digital-to-analog converters, said offset memory storing respective offset correction characteristics of said respective digital-to-analog converters,
- a gain memory having a unique address corresponding to each of said plurality of digital-to-analog converters, said gain memory storing respective gain correction characteristics of said respective digital-to-analog converters, and
- calibration means to receive original digital data for a particular digital-to-analog converter and respective offset correction characteristics and gain correction characteristics for said particular digital to analog converter and to adjust said original digital data utilizing said respective stored offset and gain correction characteristics to produce adjusted digital data that, when inputted into a said respective digital-to-analog converter, produce an analog signal that corresponds to said original digital data.

15. The system of claim 14 wherein said calibration means comprises a multiplier/accumulator circuit which produces said adjusted digital data according to the equation $y = mx + b$ where,
- y is said adjusted digital data,
- m is a said gain correction characteristic,
- x is said original digital data, and
- b is a said offset correction characteristic.

16. The system of claim 15 further comprising
- a control memory for storing control signals to control said multiplier/accumulator circuit, said control memory being addressed by an address which corresponds to an address for said gain memory and said offset memory and a DAC address.

17. The system of claim 16 further comprising
- a state machine for controlling said multiplier/accumulator circuit in response to at least one said control signal from said control memory.

18. The system of 14 further comprising
- a system data bus connected to provide said original digital data to said calibration means, a D/A data bus connected to provide said adjusted digital data from said calibration means to said plurality of digital-to analog converters, a system address bus to provide DAC addresses and
- an output multiplexer which is connected to selectively output to said D/A data bus either said original digital data from said system data bus or said adjusted digital data from said calibration means after address information has been sent to digital-to-analog converters.

19. The system claim 18 further comprising
- an echo memory connected to said system data bus to store said original digital data for respective said converters, and
- a read back multiplexer which is connected to selectively output either said original data stored in said echo memory or data provided over said module data bus.

20. The system of claim 19 further comprising
- means to store the last output of said calibration means, said means to store having an output that is provided as a further input to said readback multiplexer.

* * * * *